US008643103B2

(12) United States Patent
Kawashima

(10) Patent No.: US 8,643,103 B2
(45) Date of Patent: Feb. 4, 2014

(54) SEMICONDUCTOR DEVICE INCLUDING GATE CONTACT REGION AND PROTRUDING GATE ELECTRODE

(75) Inventor: Yoshiya Kawashima, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 2 days.

(21) Appl. No.: 13/244,445

(22) Filed: Sep. 24, 2011

(65) Prior Publication Data
US 2012/0098060 A1 Apr. 26, 2012

(30) Foreign Application Priority Data

Oct. 20, 2010 (JP) .................................. 2010-235632

(51) Int. Cl.
*H01L 29/94* (2006.01)
(52) U.S. Cl.
USPC ........... 257/342; 257/330; 257/331; 257/340; 257/E29.201; 257/E29.26
(58) Field of Classification Search
USPC ......... 257/330, 331, 334, 335, 340, 341, 342, 257/367, 487, 493, 494, 495, E21.435, 257/E21.551, E29.005, E29.26, E29.027, 257/E29.066, E29.201; 438/268, 272
See application file for complete search history.

(56) References Cited

U.S. PATENT DOCUMENTS

| 7,659,575 B2 | 2/2010 | Matsuura et al. | |
|---|---|---|---|
| 2005/0029584 A1* | 2/2005 | Shiraishi et al. | 257/329 |
| 2006/0065925 A1* | 3/2006 | Yoshida | 257/329 |
| 2007/0093019 A1* | 4/2007 | Rieger et al. | 438/243 |
| 2008/0150018 A1* | 6/2008 | Tanabe | 257/330 |

FOREIGN PATENT DOCUMENTS

| JP | 2001-217419 A | 8/2001 |
|---|---|---|
| JP | 2009-032951 A | 2/2009 |

OTHER PUBLICATIONS

P. Goarin, Proceedings of the 19th International Symposium on Power Semiconductor Devices & ICs, 2007, pp. 61-64.
Y. Kawashima, Proceedings of the 22nd International Symposium on Power Semiconductor Devices & ICs, 2010, pp. 329-332.

* cited by examiner

*Primary Examiner* — Matthew E Warren
(74) *Attorney, Agent, or Firm* — McGinn Intellectual Property Law Group, PLLC

(57) ABSTRACT

A semiconductor device for preventing an outer well from being separated by a trench gate electrode from the well of a cell region while suppressing increase in the gate resistance in which buried gate electrodes extending in a direction overlapping a gate contact region extend only before a gate electrode so as not to overlap the gate electrode, the source contact situated between each of the buried gate electrodes is shorter than the buried gate electrode in the vertical direction, the ends of the buried gate electrodes on the side of the gate electrode are connected with each other by a buried connecting electrode disposed before the gate electrode, the buried connecting electrode extends in a direction parallel with the longer side of the semiconductor device, and is not connected to the buried gate electrode on the side of the contact situated adjacent to the contact-side buried gate electrode.

7 Claims, 14 Drawing Sheets

SEMICONDUCTOR DEVICE INCLUDING GATE CONTACT REGION AND PROTRUDING GATE ELECTRODE

CROSS-REFERENCE TO RELATED APPLICATIONS

The disclosure of Japanese Patent Application No. 2010-235632 filed on Oct. 20, 2010 including the specification, drawings, and abstract is incorporated herein by reference in its entirety.

BACKGROUND

The present invention concerns a semiconductor device having a trench gate electrode.

High withstanding voltage semiconductor devices include semiconductor devices of a type having a trench gate electrode, for example, vertical MOSFET or IGBT. A requirement for such semiconductor devices is that on resistance should be low. Refinement of semiconductor devices is a method for lowering the on resistance. However, along with refinement, a problem has been caused in recent years in that the distance between gate electrodes is decreased to increase the parasitic capacitance of the gate electrode. In view of the above, FOM (Figure Of Merit), that is, (on resistance)×(parasitic capacitance of gate electrode) has been used recently as one of the measures showing the performance of a semiconductor device having the trench gate structure.

One of the techniques of improving FOM includes a method of lowering the on resistance by adopting a structure of ensuring the withstanding voltage of the semiconductor device to increase the impurity concentration of an epitaxial layer and lower the resistance. For example, P. Goarin, et al. disclose a method of ensuring the withstanding voltage of a semiconductor device by forming a deep trench and forming a thick oxide film inside the trench (Proceedings of 19th International Symposium on Power Semiconductor Devices & ICs, 2007, pp. 61-64). Further, Y. Kawashima, et. al disclose a method of ensuring the withstanding voltage of a semiconductor device by using a pn junction (Proceedings of the 22nd International Symposium on Power Semiconductor Devices & ICs, 2010, pp. 329-332). Japanese Unexamined Patent Publication No. 2009-32951 describes that the lowering of the withstanding voltage of the semiconductor device can be prevented by extending a well as far as a peripheral region adjacent to a cell region.

Japanese Unexamined Patent Publication No. 2001-217419 describes that local increase of an electric field intensity exerting on a gate insulating film can be prevented by forming corners of the trench substantially in an arcuate shape in a planar layout.

SUMMARY

When an impurity layer of a conduction type opposite to that of an epitaxial layer (that is, an impurity layer of a structure identical with the well of a cell region) is disposed to the outer periphery surrounding the cell region, since a pn junction is formed between the impurity region and the epitaxial layer, withstanding voltage at the outer periphery can be ensured. However, since the trench gate electrode is formed more deeply than the impurity region (outer well) described above, the outer well is put to a floating state being separated by the trench gate electrode from the well of the cell region. For preventing this, it is necessary to skillfully design a planar layout for the trench gate electrode. On the other hand, since the trench gate electrode is extended around for a long distance, the gate resistance may be increased depending on the planar layout.

Accordingly, it is necessary that the planar layout of the trench gate electrode be designed skillfully so as to suppress the external well from being separated from the well of the cell region by the trench gate electrode while suppressing increase in the gate resistance.

According to one aspect of the present invention, there is provided a semiconductor device including:

a semiconductor substrate, a first conduction type semiconductor layer formed over the semiconductor substrate, a second conduction type impurity layer formed in the surface layer of the semiconductor layer, a first conduction type impurity layer formed to the surface layer of the second conduction type impurity layer excluding an edge, a gate contact region formed by inwardly concaving the first conduction type impurity layer in a plan view, an upper gate electrode at least a portion of which is formed by way of an insulating layer over a region of the second conduction type impurity layer in which the first conduction type impurity layer is not formed, surrounding the first conduction type impurity layer, and inwardly protruding at a portion overlapping the gate contact region in a plan view, plural first buried gate electrodes formed in a region of the semiconductor layer in which the first conduction type impurity layer is formed, buried in the semiconductor layer more deeply than the second conduction type impurity layer, extending in parallel with each other along a first direction, and extending on both ends thereof beyond the first conduction type impurity layer respectively thereby being connected to the upper gate electrode, a buried connecting electrode buried in the semiconductor layer at a position overlapping the upper gate electrode to a depth identical with that of the first buried gate electrode, and connecting the ends of the first buried gate electrodes to each other, and source contacts buried in the semiconductor layer more deeply than the first conduction type impurity layer and more shallowly than the bottom of the second conduction type impurity layer, and each situated between each of the first buried gate electrodes, in which at least some of the first buried gate electrodes extending in a direction overlapping the upper gate electrode situated in the gate contact region are situated at the ends thereof over the edge of the gate contact region in a plan view, the ends are connected with each other by the first buried connecting electrode, and the first buried connecting electrode is not connected to the first buried gate electrode on the side of the contact as the first buried gate electrode situated adjacent to the first buried gate electrodes connected each other at the ends thereof by the first buried connecting electrode.

According to the aspect of this invention, since the PN junction is formed between the second conduction type impurity layer situated in the gate contact region and the semiconductor layer, withstanding voltage in the vertical direction can be ensured at the outer periphery of the first conduction type impurity layer. Further, while the ends of the first buried gate electrodes are connected with each other by the first buried connecting electrode near the gate contact region, the first buried connecting electrode is not connected to the first buried gate electrode on the side of the contact. Accordingly, the second conduction type impurity layer situated in the gate contact region can be connected to the second conduction type impurity layer situated in the region in which the first conduction type impurity layer is formed at a portion between the first buried gate electrode on the side of the contact and the first buried gate electrode situated in adjacent therewith. The second conduction type impurity layer situated in the layer in which the first conduction type impurity layer is formed is provided with a predetermined potential by the source contact. Accordingly, the second conduction type impurity layer situated in the gate contact region can be prevented from floating.

Further, since the first buried gate electrodes situated at the end thereof on the edge of the gate contact region are connected to each other by the first buried connecting gate electrode, increase in the gate resistance can be suppressed.

According to the aspects of the invention, the outer well can be prevented from being disconnected by the trench gate electrode from the well of the cell region while suppressing the increase in the gate resistance.

DETAILED DESCRIPTION

Figure 1:
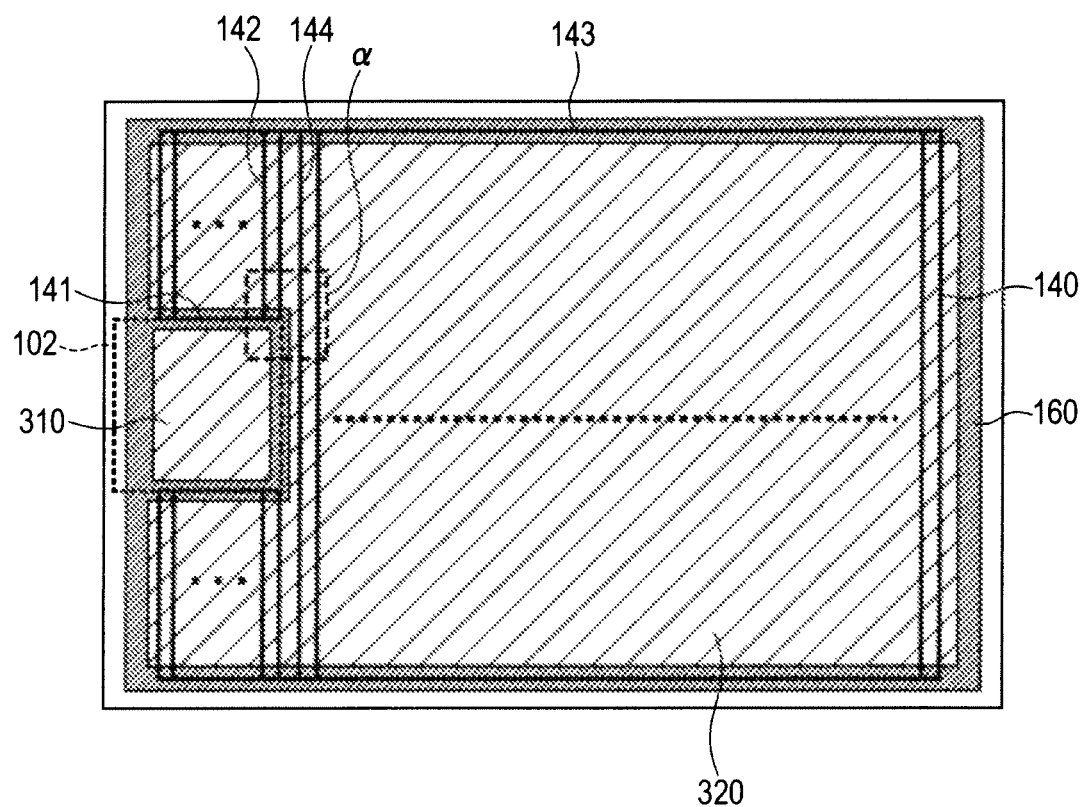
FIG. 1 is a plan view showing a configuration of a semiconductor device according to a first embodiment.

The present invention is to be described by way of preferred embodiments with reference to the drawings. Throughout the drawings, identical constitutional elements carry the same reference numerals for which explanation is to be omitted optionally.

First Embodiment

Figure 2:
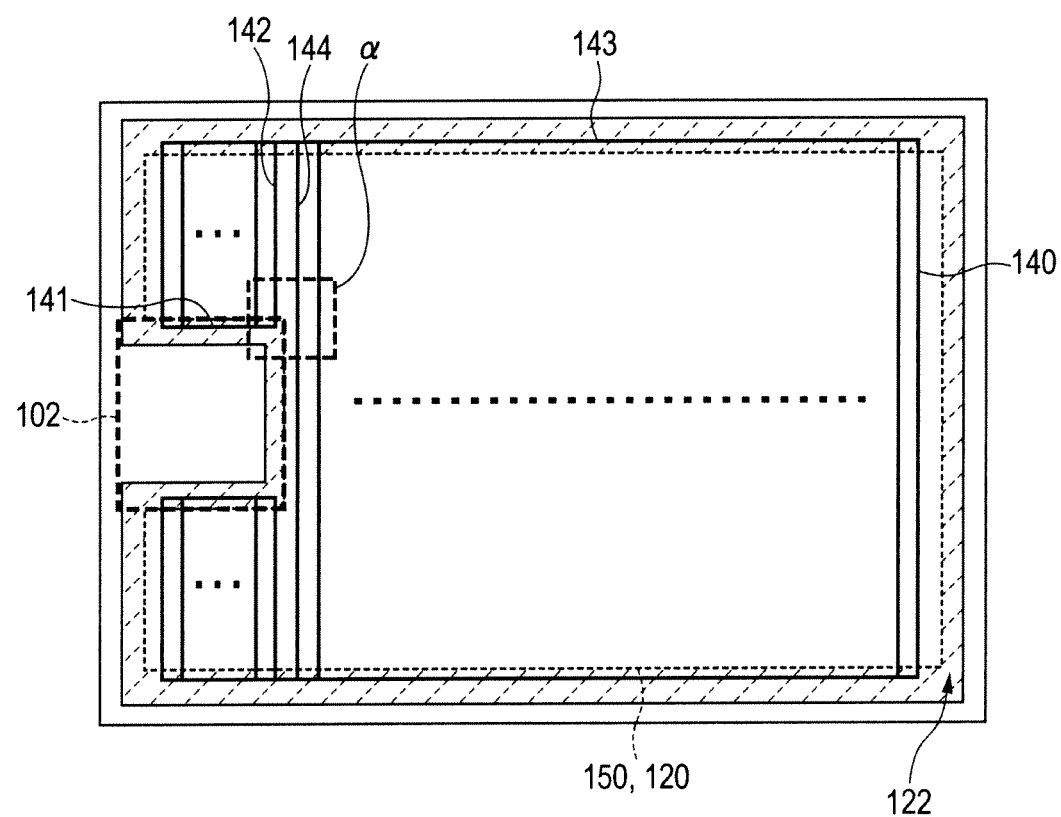
FIG. 2 is a plan view showing a layout of a second conduction type impurity layer and an outer peripheral impurity layer.
Figure 3:
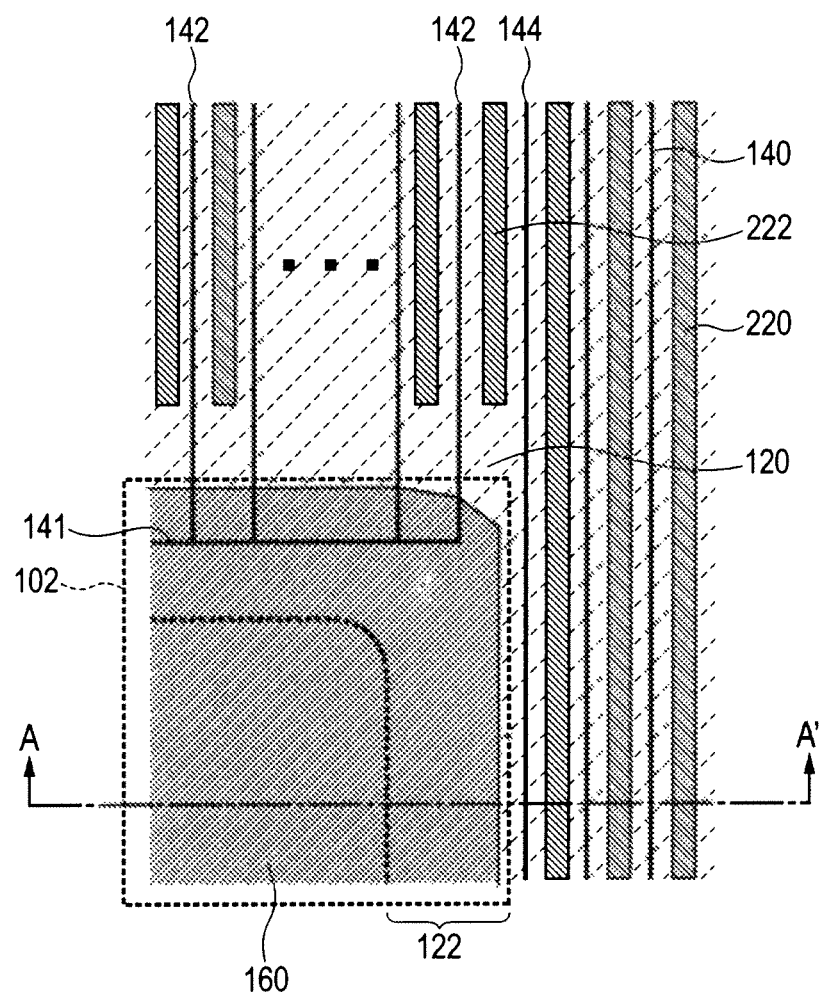
FIG. 3 is an enlarged plan view showing a layout of a buried gate electrode in a region α in FIG. 1.
Figure 4:
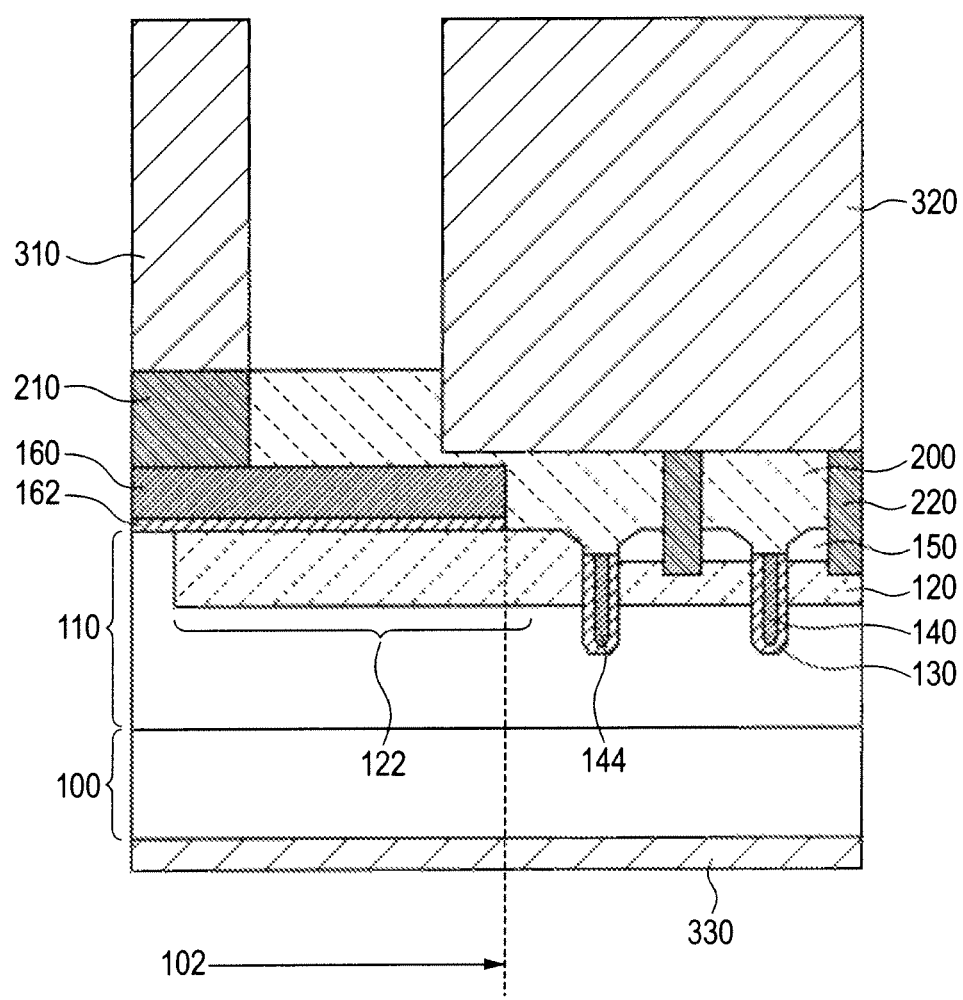
FIG. 4 is a cross sectional view along A-A' in FIG. 3.

FIG. 1 is a plan view showing a configuration of a semiconductor device according to a first embodiment. FIG. 2 is a plan view showing a layout of a second conduction type impurity layer 120 and an outer peripheral impurity layer 122 of the semiconductor device shown in FIG. 1. FIG. 3 is an enlarged plan view showing a layout of a buried gate electrode 140 in a region a shown by dotted lines in FIG. 1 and FIG. 2. FIG. 4 is a cross sectional view along A-A' in FIG. 3.

A semiconductor device according to this embodiment has a semiconductor substrate 100, a semiconductor layer 110, a second conduction type impurity layer 120, a first conduction type impurity layer 150, a gate contact region 102, an upper gate electrode 160, plural buried gate electrodes 140, buried connecting electrodes 141, 143, and source contacts 220. As shown in FIG. 4, the semiconductor layer 110 is formed over the semiconductor substrate 100 and has a first conduction type (for example, n type). As shown in FIG. 4, the second conduction type impurity layer 120 is formed on the surface layer of the semiconductor layer 110 and has, for example, a p-conduction type. As shown in FIG. 2 and FIG. 4, the first conduction type impurity layer 150 is formed in a region of the surface layer of the second conduction type impurity layer 120 excluding an edge. As shown in FIG. 4, the gate contact region 102 is formed by inwardly concaving the first conduction type impurity layer 150 in a plan view. As shown in FIG. 1 and FIG. 4, at least a portion of the upper gate electrode 160 is formed by way of the insulating layer 162 over a region of the second conduction type impurity layer 120 in which the first conduction impurity layer 150 is not formed. The upper gate electrode 160 surrounds the first conduction type impurity layer 150 and a portion thereof overlapping the gate contact region 102 protrudes inward in a plan view. As shown in FIG. 4, the buried gate electrodes 140 are formed in a region of the semiconductor layer 110 in which the first conduction impurity layer 150 is formed, and buried in the semiconductor layer 110 more deeply than the second conduction type impurity layer 120. As shown in FIGS. 1, 2, and 3, the buried gate electrodes 140 extend in parallel with each other along a first direction (vertical direction in the drawing) and extend at both ends thereof beyond the first conduction type impurity layer 150 respectively and are connected with the upper gate electrode 160. The buried connecting electrodes 141, 143 are buried in the semiconductor layer 110 at positions overlapping the upper gate electrode 160 to a depth identical with that of the buried gate electrode 140, and connect the ends of the buried gate electrodes 140 to each other. The source contacts 220 are buried in the semiconductor layer 110 more deeply than the first conduction type impurity layer 150 and more shallowly than the bottom of the second conduction type impurity layer 120, and situated between the buried gate electrodes 140 to each other. Then, at least a portion of the buried gate electrodes 142 extending in the direction overlapping the gate electrodes 160 situated in the gate contact region 102 is situated at the ends thereof on the edge of the gate contact region 102 and the ends are connected with each other by the buried connecting electrode 141. Further, the buried connecting electrode 141 is not connected with the buried gate electrode 144 which is the buried gate electrode 140 situated in adjacent with the buried gate electrodes 142 connected with each other at the ends thereof by the buried connection electrode 141. Description is to be made more specifically.

In this embodiment, the semiconductor device has a vertical type MOS transistor. The semiconductor substrate 100 has a first conduction type (for example, n type). The semiconductor layer 110 is formed by epitaxial growing over the semiconductor substrate 100 and functions as a drain of the MOS transistor. At the surface of the semiconductor 100 not formed with the semiconductor layer 110, a drain electrode 330 is disposed for the entire surface. The second conduction type impurity layer 120 functions as a well of the MOS transistor excluding a region to form the outer peripheral impurity layer 122. The first conduction type impurity layer 150 functions as a source of the MOS transistor. A constant potential, for example, a ground potential is applied by the source contacts 220 to the first conduction type impurity layer 150 and the second conduction impurity layer 120. The upper ends of the source contacts 220 are connected with the source electrode 320 shown in FIG. 1 and FIG. 4.

As shown in FIG. 4, the buried gate electrodes 140 are buried in trenches formed in the semiconductor layer 110. A gate insulating film 130 is formed at the inner peripheral surface and the bottom of the trenches. The buried gate electrodes 140 are buried in the semiconductor layer 120 more deeply than the second conduction type impurity layer 120. Accordingly, the second conduction type impurity layer 120 is separated by the semiconductor layer 110. Then, a portion of the region of the second conduction type impurity layer 120 situated to the outside of the buried gate electrode 140 at the outermost side in the second conduction type impurity layer 120 forms the outer peripheral impurity layer 122. In the embodiment shown in FIG. 1 and FIG. 2, the planar shape of the semiconductor device is rectangular. Then, the outer peripheral impurity layer 122 is formed along the edge of the semiconductor device so as to surround the first conduction type impurity layer 150.

In a plan view, a portion of the outer periphery of the first conduction type impurity layer 150 is inwardly concaved. Then, the concaved portion forms a gate contact region 102. In the embodiment shown in FIG. 1 and FIG. 2, the gate contact region 102 is formed substantially at a central portion of the shorter side of the semiconductor device in a plan view. A portion of the upper gate electrode 160 and a gate electrode 310 are formed in the gate contact region 102. The gate electrode 310 is in contact with the upper gate electrode 160 at a portion situated to the gate contact region 102. Further, the upper gate electrode 160 is disposed along four sides of the semiconductor device. A portion of the upper gate electrode 160 that extends along the longer side of the semiconductor device is connected to the buried gate electrodes 140. Therefore, the gate electrode 310 is connected to the buried gate electrodes 140 by way of the upper gate electrode 160.

As shown in FIGS. 1, 2, and 3, the buried gate electrodes 140 extend from the vicinity of one longer side to the vicinity of the other longer side of the semiconductor device in the direction parallel with the shorter side of the semiconductor device in a plan view. Then, the ends of the buried gate electrodes 140 are connected to the upper gate electrode 160 near the longer side of the semiconductor device. Further, buried connecting electrodes 143 extend near the longer side of the semiconductor device in parallel with the longer side of the semiconductor device such that the buried connecting electrode 143 overlap the upper gate electrode 160. Then, the ends of the buried gate electrodes 140 are connected with each other by the buried connecting electrode 143.

While the buried gate electrodes 140 are disposed in plurality each at a predetermined distance in parallel with each other, the buried gate electrodes 142 of the buried gate electrodes 140 that extend in the direction overlapping the contact region 102 in a plan view extend only before the gate electrode 310 so as not to overlap the gate electrode 310. Further, the length of the source contact 222 situated between each of the buried gate electrodes 142 is made shorter than the buried gate electrode 142 in the vertical direction in the drawing. Then, the ends of the buried gate electrodes 142 on the side of the gate electrode 310 are connected with each other by the buried connecting electrode 141 disposed before the gate electrode 310. The buried connecting electrode 141 extends in a direction parallel to the longer side of the semiconductor device. The buried connecting electrode 141 and the ends of the buried gate electrodes 142 overlap the upper gate electrode 160.

Then, the buried connecting electrode 141 is not connected to the buried gate electrode 144 situated adjacent to the buried gate electrode 142. Accordingly, as shown in FIG. 3, the outer peripheral impurity layer 122 is connected to the second conduction type impurity layer 120 at a portion between the buried gate electrode 142 and the buried gate electrode 144. The source contact 222 is disposed also between the buried gate electrode 142 and the buried gate electrode 144. Accordingly, the outer peripheral impurity layer 122 is connected to the source contact 222 by way of the second conduction type impurity layer 120 situated between the buried gate electrode 142 and the buried gate electrode 144.

Figure 5:
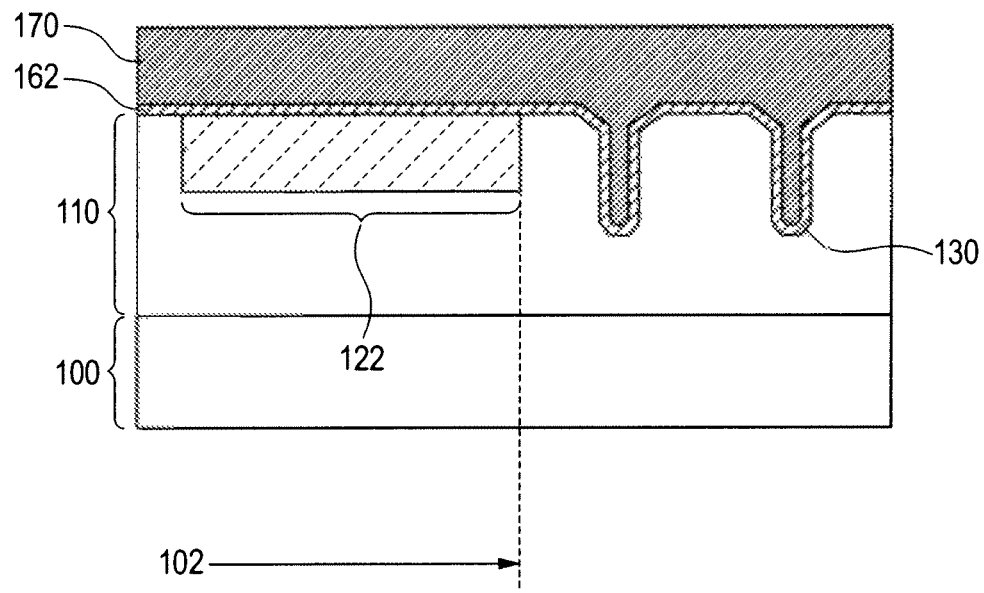
FIG. 5 is a cross sectional view showing a method of manufacturing a semiconductor device shown in FIG. 1 to FIG. 4.
Figure 6:
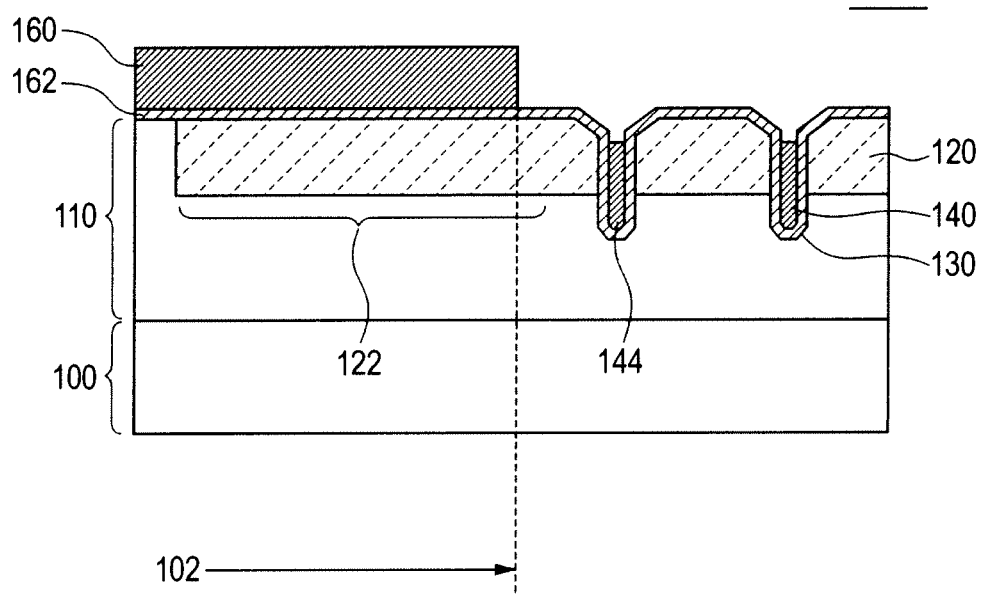
FIG. 6 is a cross sectional view showing a method of manufacturing a semiconductor device shown in FIG. 1 to FIG. 4.
Figure 7:
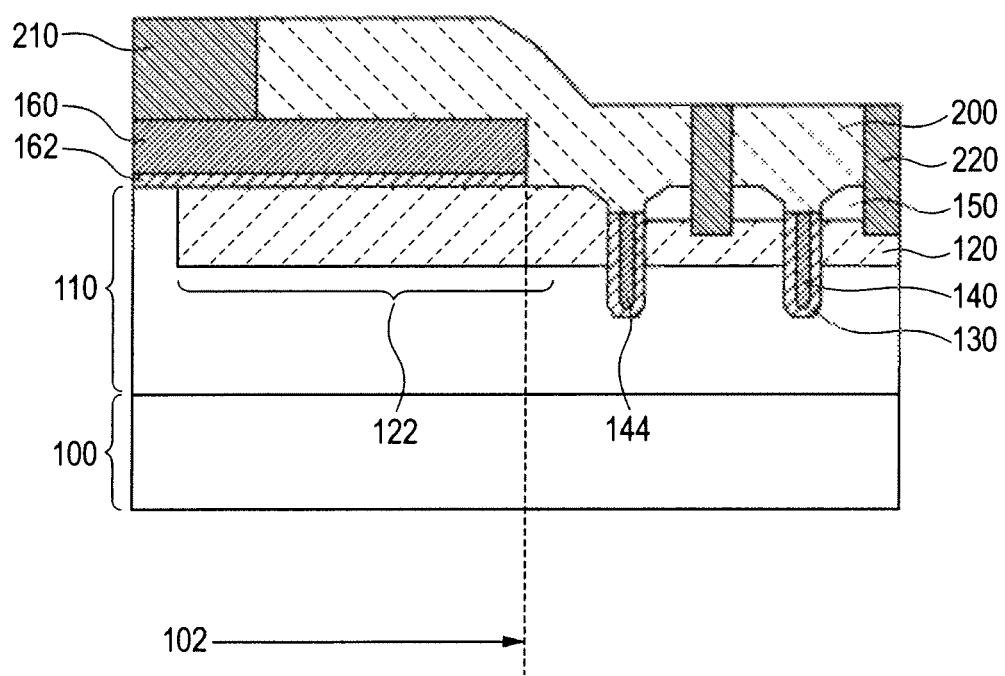
FIG. 7 is a cross sectional view showing a method of manufacturing a semiconductor device shown in FIG. 1 to FIG. 4.

FIG. 5, FIG. 6, and FIG. 7 are cross sectional views showing a method of manufacturing the semiconductor device shown in FIG. 1 to FIG. 4. At first, as shown in FIG. 5, a semiconductor layer 110 is epitaxially grown over a semiconductor substrate 100. Then, a mask pattern (not illustrated) is formed, and a second conduction type impurity is implanted into the semiconductor layer 110 by using the mask pattern as a mask. Thus, an outer peripheral impurity layer 122 is formed. Then, trenches are formed for forming buried gate electrodes 140 in the semiconductor layer 110. Then, the surface of the semiconductor layer 110 is thermally oxidized. Thus, the gate insulating film 130 and an insulating layer 162 are formed. Then, a conductive film 170, for example, a polysilicon film is formed over the insulating layer 162 and in the trenches.

As shown in FIG. 6, the conductive film 170 is removed selectively. Thus, an upper gate electrode 160 and buried gate electrodes 140 (including buried gate electrodes 142, 144, etc.) are formed. Then, a second conduction type impurity is implanted into the semiconductor layer 110 by using the upper gate electrode 160 as a mask. Thus, a second conduction type impurity layer 120 is formed. Further, a mask pattern is formed over the second conduction type impurity layer 120, and a first conduction type impurity is implanted into the second conduction type impurity layer 120 by using the mask pattern as a mask. Thus, a first conduction type impurity layer 150 is formed. Then, a heat treatment for activating the implanted impurity is performed at any timing. Since the impurities in the second conduction type impurity layer 120 and the outer peripheral impurity layer 122 are diffused during the heat treatment, the second conduction type impurity layer 120 and the outer peripheral impurity layer 122 are joined to each other. Then, when the outer peripheral impurity layer 122 is adapted to stick out from the upper gate electrode 160 to the second conduction type impurity layer 120 in a plan view upon formation of the outer peripheral impurity layer 122, the second conduction type impurity layer 120 and the outer peripheral impurity layer 122 are joined reliably.

Then, as shown in FIG. 7, an interlayer insulating film 200 is formed over the upper gate electrode 160 and the semiconductor layer 110. Then, holes are formed by selectively removing the interlayer insulating film 200 and a conductor material is buried in the holes. Thus, a gate contact 210 and a source contact 220 are formed. Then, a gate electrode 310 and a source electrode 320 are formed over the interlayer insulating film 200.

The function and the effect of this embodiment are to be described below. As has been described above, the buried connecting electrode 141 is not connected to the buried gate electrode 144 situated adjacent to the buried gate electrode 142. Therefore, the outer peripheral impurity layer 122 is connected to the source contact 222 by way of the second conduction type impurity layer 120 situated between the buried gate electrode 142 and the buried gate electrode 144. Further, since the source contact 222 is connected by way of the source electrode 320 to the source contact 220, this can prevent the outer peripheral impurity layer 122 from floating.

Further, since the buried connecting electrode 141 connects the buried gate electrodes 142 with each other, increase in the gate resistance of the buried gate electrodes 140 at a portion of the buried gate electrodes 142 can be suppressed.

Figure 8:
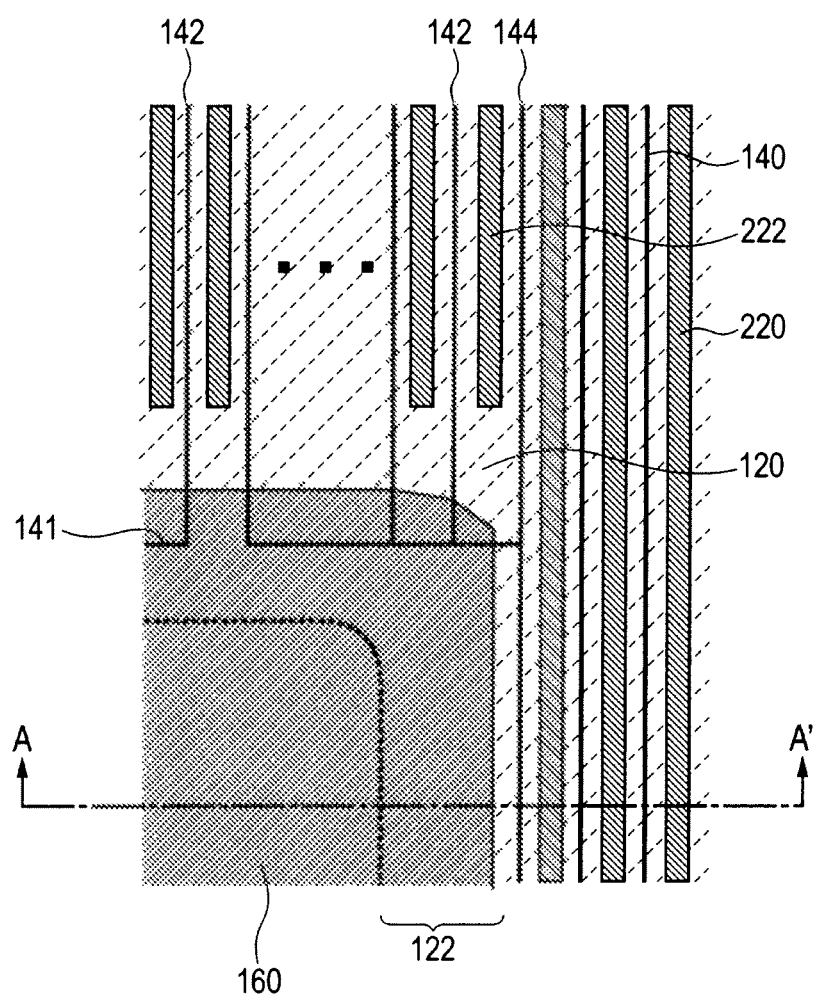
FIG. 8 is an enlarged plan view of a semiconductor device according to a comparative embodiment.

The effect is to be described with reference to a comparative embodiment shown in FIG. 8. In the comparative embodiment shown in FIG. 8, the buried connecting electrode 141 is disconnected in the midway and does not connect a portion of the buried gate electrodes 142 with each other. Instead, the buried connecting electrode 141 is connected to the buried gate electrode 144. In such a case, since the outer peripheral impurity layer 122 is connected to the second conduction type impurity layer 120 at a portion in which the buried connecting electrode 141 is disconnected in the midway, it is not in the floating state. However, since the buried connecting electrode 141 is disconnected in the midway, the gate resistance of the buried gate electrode 142 is increased. On the contrary, in this embodiment, since the buried connecting electrode 141 connects all of the buried gate electrodes 142 with each other, increase in the gate resistance of the buried gate electrodes 142 can be suppressed.

Second Embodiment

Figure 9:
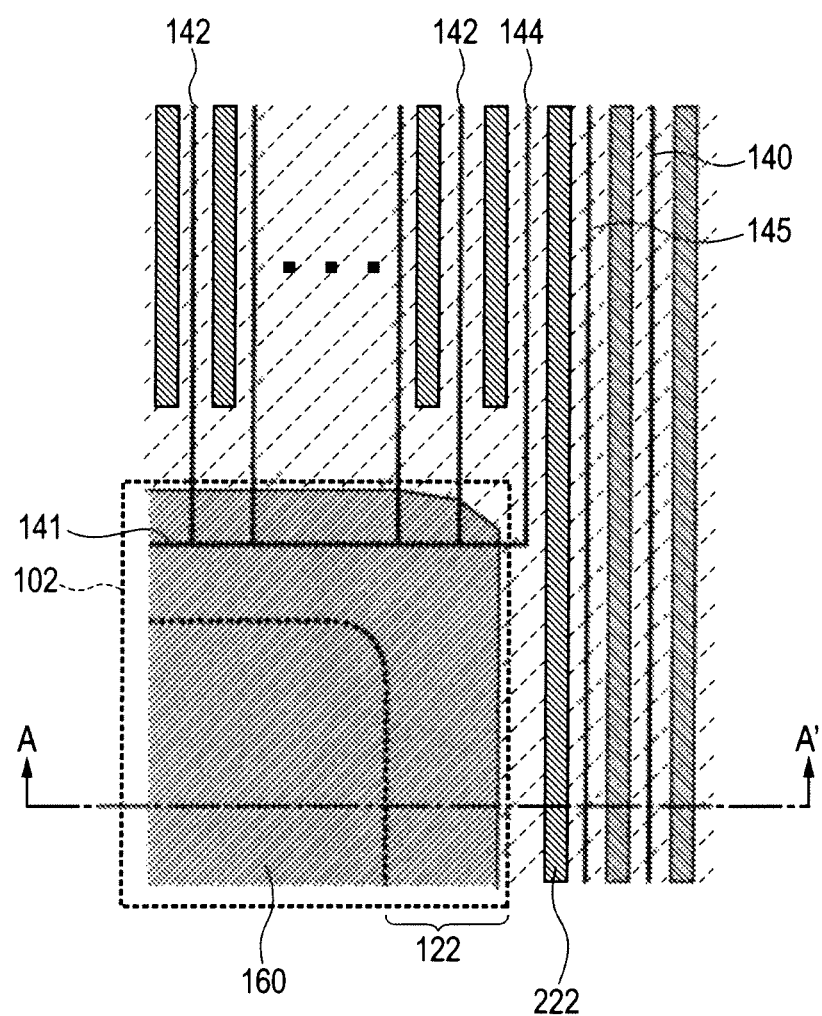
FIG. 9 is an enlarged plan view showing a configuration of a semiconductor device according to a second embodiment.
Figure 10:
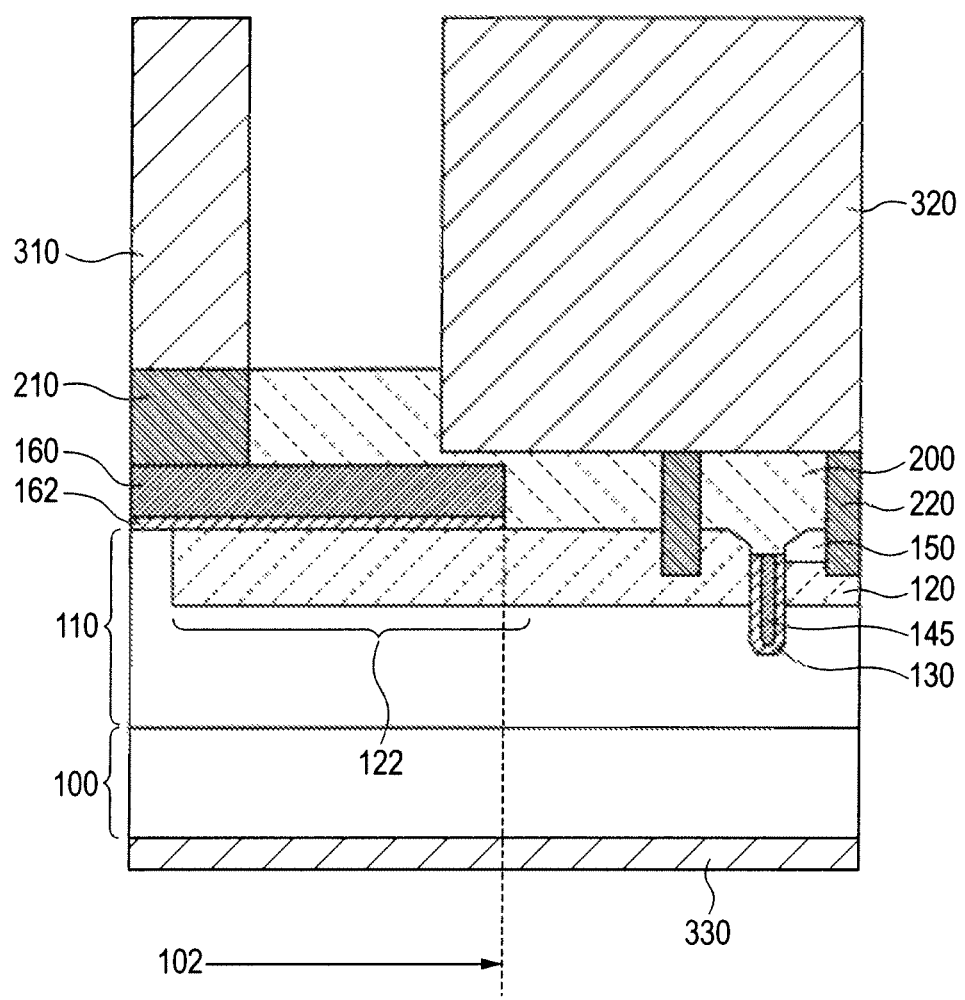
FIG. 10 is a cross sectional view along A-A' in FIG. 9.

FIG. 9 is an enlarged plan view showing a configuration of a semiconductor device according to a second embodiment, which corresponds to FIG. 3 for the first embodiment. FIG. 10 is a cross sectional view along A-A' in FIG. 9. The semiconductor device according to this embodiment has the same configuration as that of the semiconductor device according to the first embodiment except for the points to be described below.

At first, a buried gate electrode 144 situated adjacent to a buried gate electrode 142 has a length identical with that of the buried gate electrode 142, and the position for the end is identical with that of the buried gate electrode 142 in the vertical direction in the drawing. Then, the ends of the buried gate electrode 144 are connected by the buried connecting electrode 141.

Further, in the source contacts 220, the source contact 222 extending between the buried gate electrode 144 and the buried gate electrode 145 situated adjacent thereto extends also between the portion of the upper gate electrode 160 situated to the gate contact region 102 and the buried gate electrode 145.

Also in this embodiment, the effect identical with that of the first embodiment can be obtained. Further, while the source contact 222 extends also between the portion of the upper gate electrode 160 situated to the gate electrode contact region 102 and the buried gate electrode 145, the buried gate electrode 144 is not formed between the source contact 222 and the outer peripheral impurity layer 122. Accordingly, since the distance from the portion of the source contacts 220 connected to the outer peripheral impurity layer 122 (that is, the source contact 222) to the outer peripheral impurity layer 122 is shortened, voltage loss between the source contact 222 and the outer peripheral impurity layer 122 can be suppressed.

Third Embodiment

Figure 11:
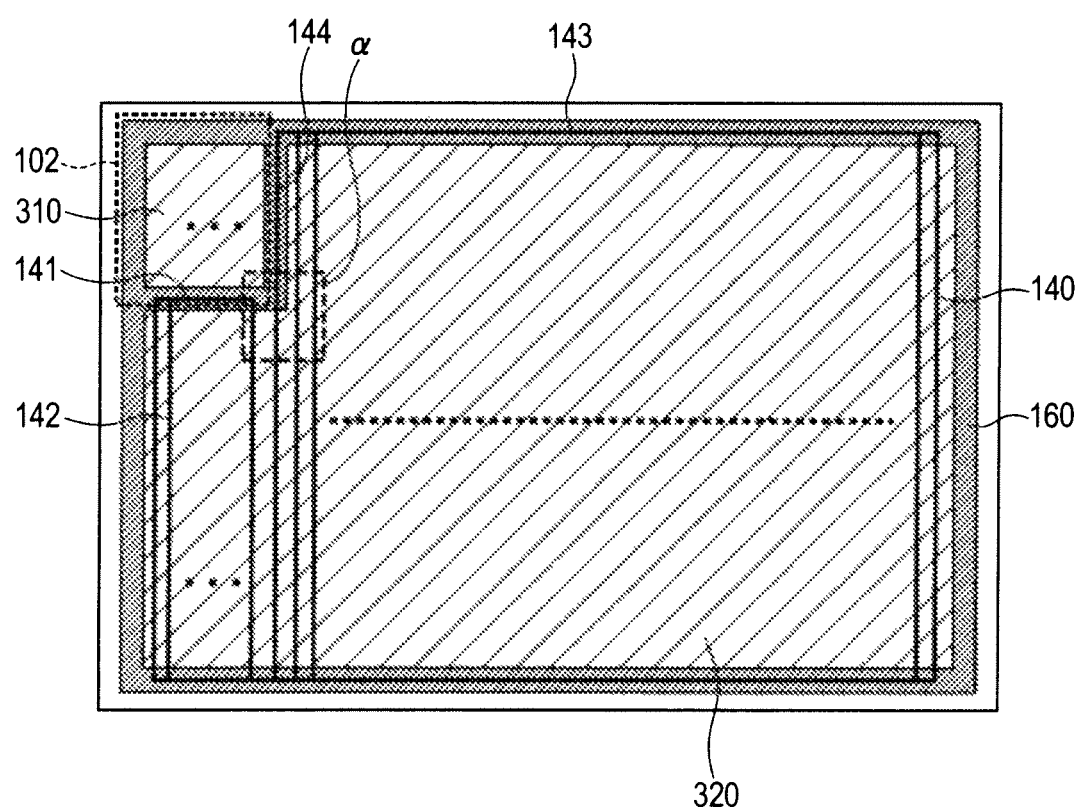
FIG. 11 is a plan view of a semiconductor device according to a third embodiment.

FIG. 11 is a plan view of a semiconductor device according to a third embodiment, which corresponds to FIG. 1 for the first embodiment. The semiconductor device according to this embodiment has the same configuration as that of the semiconductor device of the first or the second embodiment except that a gate contact region 102 is situated at a corner of the semiconductor device. FIG. 11 shows a case identical with that in the first embodiment. Also in this embodiment, the effect identical with that of the first or the second embodiment can be obtained. Further, upon packaging to a final product, the wire length required for connection from a lead frame (situated above the chip in the drawing) to a gate pad can also be shortened.

Fourth Embodiment

Figure 12:
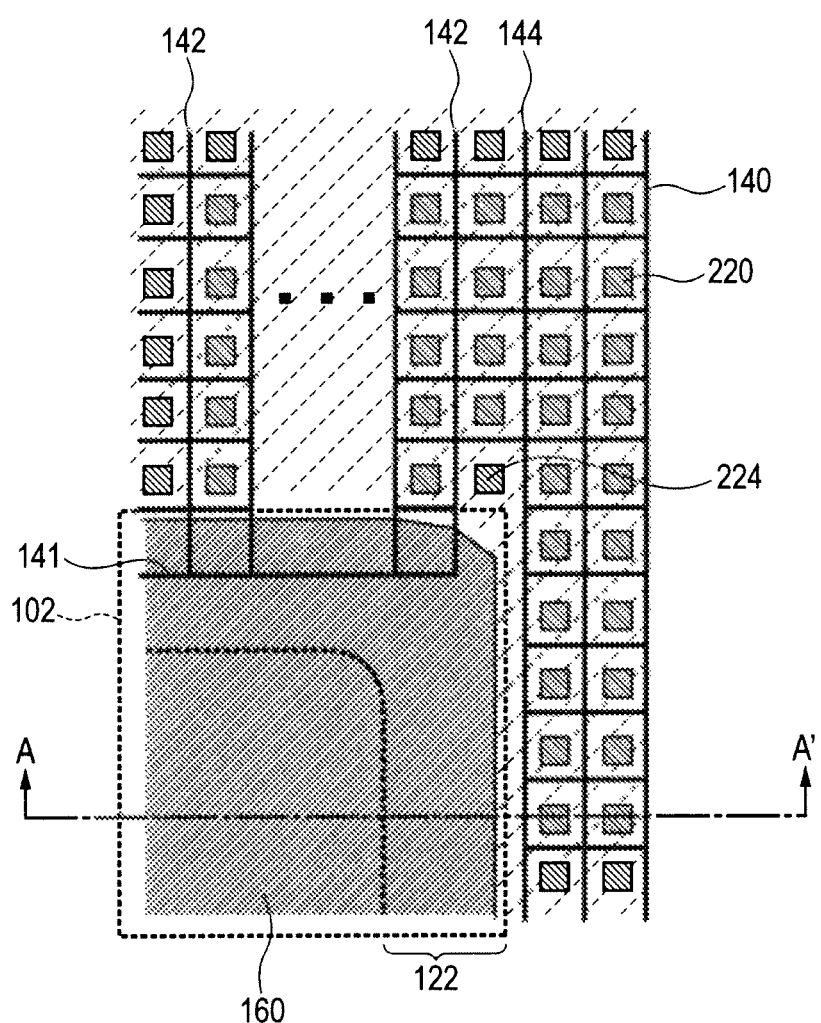
FIG. 12 is an enlarged plan view showing a configuration of a semiconductor device according to a fourth embodiment.

FIG. 12 is an enlarged plan view showing a configuration of a semiconductor device according to a fourth embodiment, which corresponds to FIG. 3 for the first embodiment. The semiconductor device of this embodiment has the same configuration as that of the first to third embodiments except for the following points. FIG. 12 shows a case identical with that in the first embodiment.

At first, buried gate electrodes 140 are formed in a network form so as to constitute a lattice. That is, the buried gate electrodes 140 are formed not only in the vertical direction in the drawing but also in the lateral direction in the drawing. Therefore, adjacent buried gate electrodes 140 are connected with each other.

Then, a source contact 220 is disposed in each lattice unit formed of the buried gate electrodes 140. The buried gate electrode 140 is not formed between the source contact 224 of the source contacts 220 adjacent to the gate contact region 102 and nearest to the buried gate 144 and the outer peripheral impurity layer 122.

Also in this embodiment, since the source contact 224 is connected by way of the second conduction type impurity layer 120 to the outer peripheral impurity layer 122, the effect identical with that of the first to third embodiments can be obtained. Further, since the buried gate electrodes 140 are formed in the lattice configuration, the gate resistance of the buried gate electrodes 140 can be lowered.

Fifth Embodiment

Figure 13:
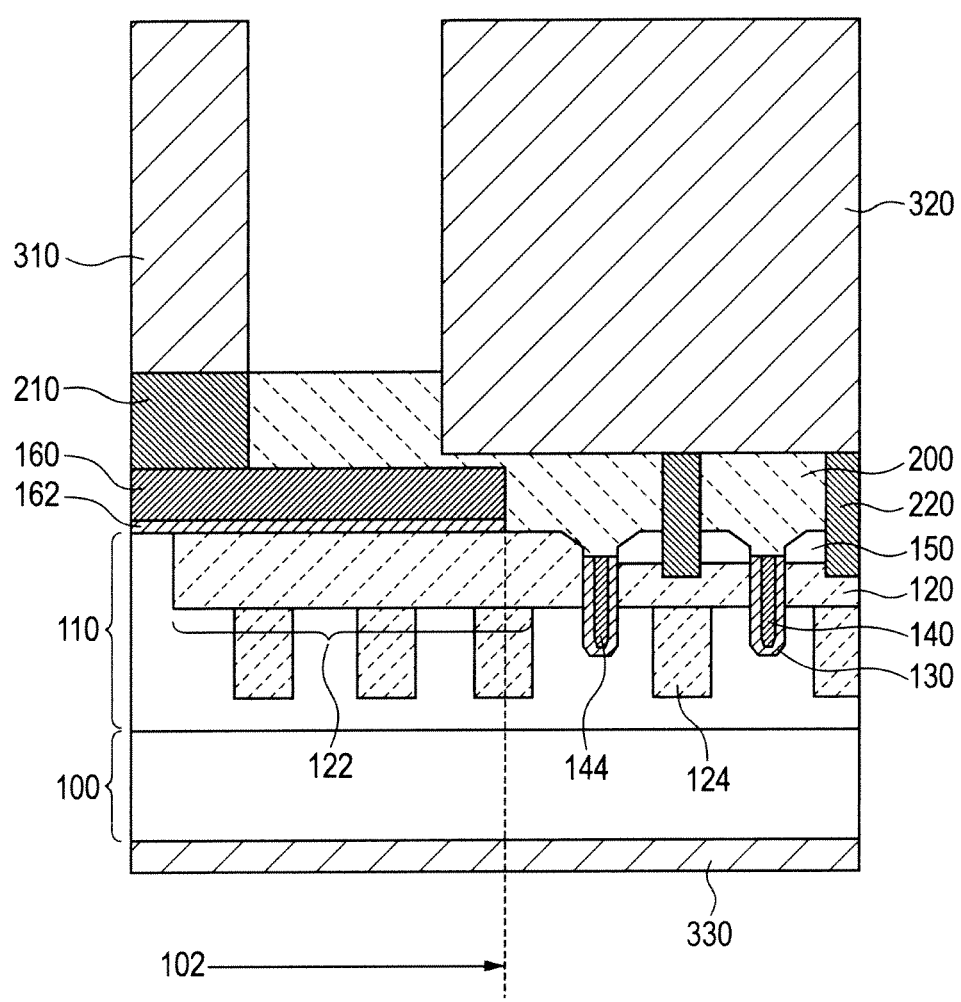
FIG. 13 is a cross sectional view of a semiconductor device according to a fifth embodiment.
Figure 14:
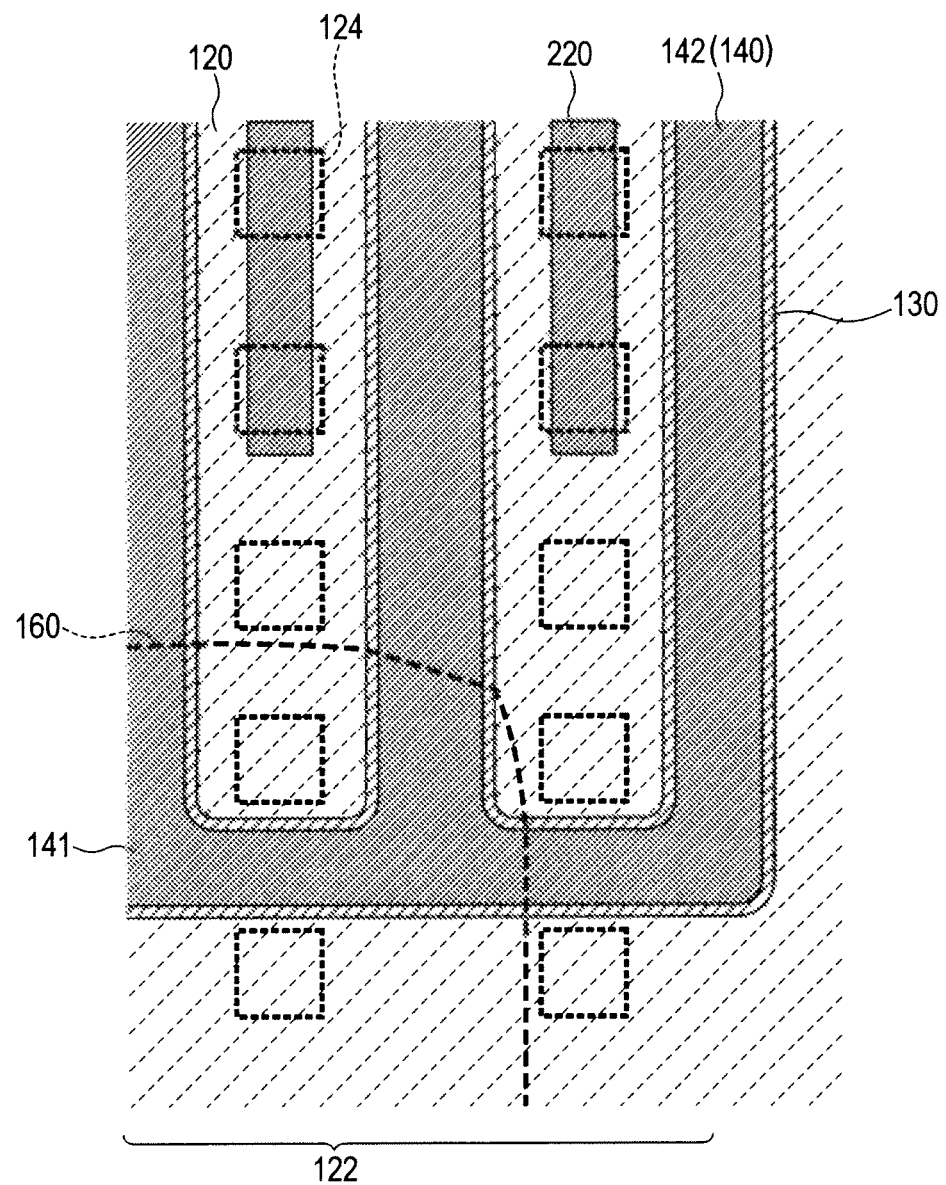
FIG. 14 is an enlarged plan view of a semiconductor device shown in FIG. 13.

FIG. 13 is a cross sectional view of a semiconductor according to a fifth embodiment, which correspond to FIG. 4 for the first embodiment. FIG. 14 is an enlarged plan view of the semiconductor device shown in FIG. 13. The semiconductor device according to this embodiment has the same configuration as that of the first to fourth embodiments except that plural second conduction type buried layers 124 are provided.

The second conduction buried layers 124 are formed in a semiconductor layer 110. The second conduction type buried layers 124 are connected at the upper ends thereof to the second conduction type impurity layer 120 or the outer peripheral impurity layer 122 and are arranged being spaced from each other. In the embodiment shown in this drawing, each of the second conduction type buried layers 124 is arranged so as to be situated at each apex of the lattice. Further, some second conduction type buried layers 124 overlap the source contacts 220 in a plan view and other second conduction type buried layers 124 overlap the outer peripheral impurity layer 122 in a plan view. In this embodiment, while the space of arranging the second conduction type buried layers 124 is identical with each other in any of the regions, this is not restrictive.

Also in this embodiment, the effect identical with that of the second embodiment can be obtained. Further, the second conduction type buried layers 124 are formed in the semiconductor layer 110 at a position deeper than the second conduction type impurity layer 120. The second conduction type buried layer 124 forms a pn junction with respect to the semiconductor layer 110, and the pn junction improves the withstanding voltage between the drain electrode 330 and the source electrode 320. Accordingly, the on-resistance of the semiconductor device can be decreased by increasing the impurity concentration in the semiconductor layer 110.

Sixth Embodiment

Figure 15:
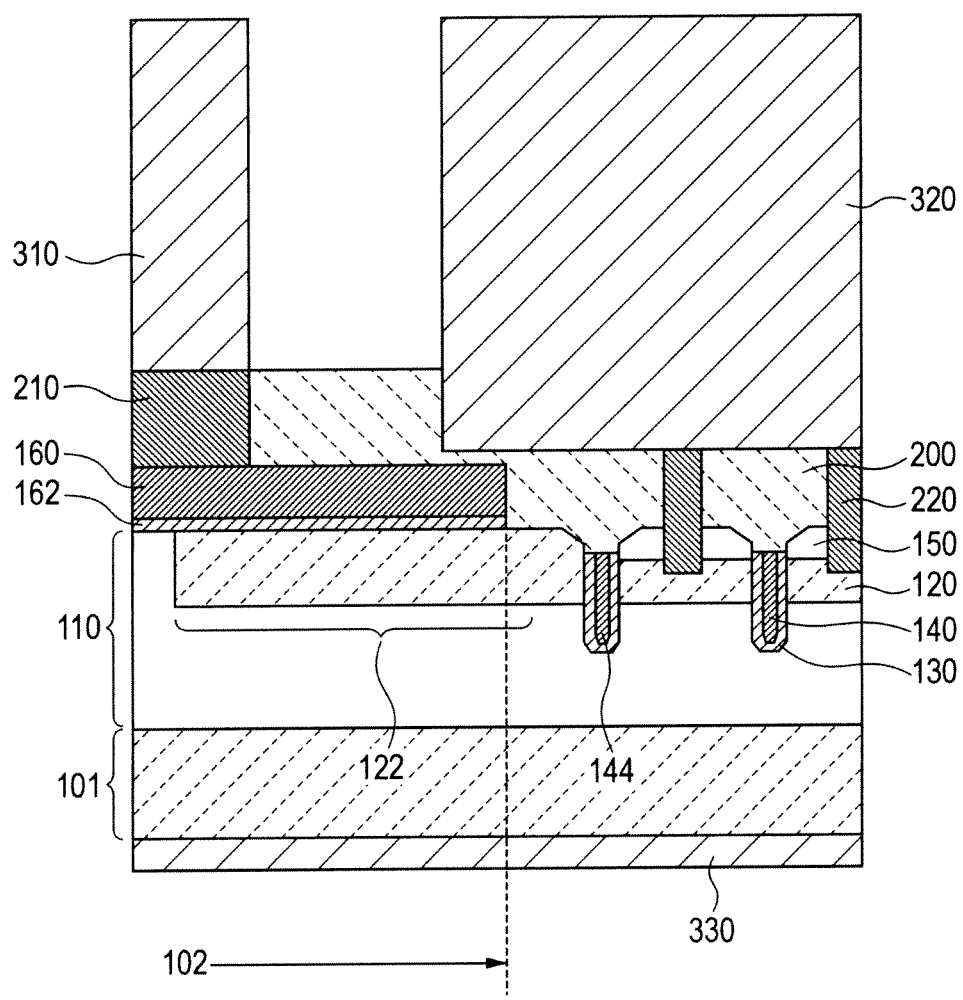
FIG. 15 is a cross sectional view showing a configuration of a semiconductor device according to a sixth embodiment.

FIG. 15 is a cross sectional view showing a configuration of a semiconductor device according to a sixth embodiment, which corresponds to FIG. 4 for the first embodiment. The semiconductor device according to this embodiment has the same configuration as that of the first to fifth embodiments except for using a second conduction type semiconductor substrate 101 instead of the first conduction type semiconductor substrate 100. That is, the semiconductor according to this embodiment operates as IGBT (Insulated Gate Bipolar Transistor). Also in this embodiment, the effect identical with that of the first to fifth embodiments can be obtained.

While the present invention has been described for preferred embodiments with reference to the drawings, they are examples of the invention and various other configurations than those described above can be adopted.

What is claimed is:

1. A semiconductor device, comprising:
a semiconductor substrate;
a first conductivity type semiconductor layer formed over the semiconductor substrate;
a second conductivity type impurity layer formed in a surface layer of the semiconductor layer;
a first conductivity type impurity layer formed in a surface layer of the second conductivity type impurity layer, excluding an edge thereof;
a gate contact region formed such that, in a plan view, the first conductivity type impurity layer extends to surround the gate contact region;
an upper gate electrode at least a portion of which is formed by way of an insulating layer over a region of the second conductivity type impurity layer in which the first conductivity type impurity layer is not formed, surrounding the first conductivity type impurity layer, wherein, in the plan view, the upper gate electrode is inwardly protruding at a portion of the upper gate electrode that overlaps with the gate contact region;
a plurality of first buried gate electrodes formed in a region of the semiconductor layer in which the first conductivity type impurity layer is formed, buried in the semiconductor layer more deeply than the second conductivity type impurity layer, extending in parallel with each other along a first direction, and extending on both ends thereof beyond the first conductivity type impurity layer respectively thereby being connected to the upper gate electrode;
a buried connecting electrode buried in the semiconductor layer at a position overlapping the upper gate electrode to a depth identical with that of the first buried gate electrodes, and connecting ends of the first buried gate electrodes to each other; and
a plurality of source contacts buried in the semiconductor layer more deeply than the first conductivity type impurity layer and more shallowly than the bottom of the second conductivity type impurity layer, and each situated between each of the first buried gate electrodes,
wherein at least some of the first buried gate electrodes extending in a direction overlapping the upper gate electrode situated in the gate contact region are situated at the ends thereof over the edge of the gate contact region in a plan view,
wherein the ends are connected with each other by the buried connecting electrode,
wherein the buried connecting electrode is not connected to the first buried gate electrodes on a side of the first buried gate electrodes situated adjacent to the first buried gate electrodes connected to each other at the ends thereof by the buried connecting electrode, and
wherein the at least some of the first buried gate electrodes extend in a direction overlapping the gate contact region, in the plan view, only before reaching to a gate electrode disposed in the gate contact region, such that the at least some of the first buried gate electrodes are devoid of overlapping with the gate electrode disposed in the gate contact region.

2. The semiconductor device according to claim 1, wherein the first buried gate electrodes on the side of the first buried gate electrodes which is the first buried gate electrodes extending in a direction passing the side of a portion of the upper gate electrode situated to the gate contact region in a plan view is situated at the end thereof to a position identical with that of the buried connecting electrode in the first direction.

3. The semiconductor device according to claim 2, wherein the first buried gate electrodes on the side of the first buried gate electrodes extends along the side of a portion of the upper gate electrode situated in the gate contact region, and the source contacts are formed between a portion of the upper gate electrode situated in the gate contact region and the first buried gate electrodes on the side of the contact.

4. The semiconductor device according to claim 1, further comprising:
second buried gate electrodes extending in a direction perpendicular to the first direction and connecting one of the first buried gate electrodes to an adjacent one of the first buried gate electrodes respectively.

5. The semiconductor device according to claim 1, further comprising:
a plurality of second conductivity type buried layers formed in a semiconductor layer and connected at the upper ends thereof to the second conductivity type impurity layer and disposed being spaced from each other.

6. The semiconductor device according to claim 1, wherein the semiconductor substrate is a first conductivity type.

7. The semiconductor device according to claim 1, wherein the semiconductor substrate is a second conductivity type.

* * * * *